United States Patent [19]

Sakazaki

[11] Patent Number: 5,196,848
[45] Date of Patent: Mar. 23, 1993

[54] CODE MODULATION SYSTEM USING MODULATED DATA CODE TABLES

[75] Inventor: Yoshihisa Sakazaki, Tokyo, Japan
[73] Assignee: Kabushiki Kaisha Toshiba, Kanagawa, Japan
[21] Appl. No.: 728,686
[22] Filed: Jul. 12, 1991
[51] Int. Cl.[5] .............................. H03M 7/00
[52] U.S. Cl. ............................ 341/58; 341/51
[58] Field of Search .............. 341/58, 68, 95, 106, 341/51, 55; 375/19, 20; 360/41

[56] References Cited

U.S. PATENT DOCUMENTS 4,520,346  5/1985  Shimada .................... 341/58
4,731,678  3/1988  Takeuchi .
4,775,985  10/1988  Busby ....................... 375/25

FOREIGN PATENT DOCUMENTS 61-196469  8/1986  Japan .

OTHER PUBLICATIONS

ITEJ Technical Report, vol. 14, No. 20, pp. 49-54; T. Uehara et al. Mar. 22, 1990, "A New 8/14 Modulation and its Application to a Small Format", Digital VTR. Vol. 32, No. 4, National Technical Report, pp. 14-17, (Aug. 1986).

Primary Examiner—A. D. Pellinen
Assistant Examiner—B. K. Young
Attorney, Agent, or Firm—Finnegan, Henderson, Farabow, Garrett and Dunner

[57] ABSTRACT

A code modulation system wherein an 8-bit input is converted to a 14-bit code by creating modulated data code tables and associating a given 8-bit input with a particular table based on the Digital Sum Variation value, the Non-Return to Zero Inverted waveform polarity, and the end-bit value of the preceding 14-bit modulated code.

4 Claims, 7 Drawing Sheets

| DSV | WAVE FORM POLARITY | SELECTION OF MODULATION CODE |
|---|---|---|
| POSITIVE | POSITIVE | MODULATION CODE WITH POSITIVE DSV |
| | NEGATIVE | MODULATION CODE WITH NEGATIVE DSV |
| 0 | POSITIVE | MODULATION CODE WITH DSV OF LESSER ABSOLUTE VALUE |
| | NEGATIVE | |
| NEGATIVE | POSITIVE | MODULATION CODE WITH NEGATIVE DSV |
| | NEGATIVE | MODULATION CODE WITH POSITIVE DSV |

Fig1.

| DSV | WAVEFORM POLARITY | END BIT | SELECTION OF CONVERSION TABLE |
|---|---|---|---|
| POSITIVE | POSITIVE | 1 | a |
| | | 0 | d |
| | NEGATIVE | 1 | b |
| | | 0 | e |
| 0 | POSITIVE | 1 | c |
| | | 0 | f |
| | NEGATIVE | 1 | c |
| | | 0 | f |
| NEGATIVE | POSITIVE | 1 | b |
| | | 0 | e |
| | NEGATIVE | 1 | a |
| | | 0 | d |

Fig. 4.

| GROUP CDS | A | B | C |
|---|---|---|---|
| -8 | 0 | 4 | 0 |
| -6 | 9 | 24 | 3 |
| -4 | 32 | 41 | 14 |
| -2 | 65 | 48 | 40 |
| 0 | 82 | 37 | 70 |
| 2 | 71 | 15 | 76 |
| 4 | 41 | 4 | 62 |
| 6 | 11 | 0 | 33 |
| 8 | 2 | 0 | 6 |

Fig. 5.

| CONVERSION TABLE | DATA GROUP | | | | | | | | |
|---|---|---|---|---|---|---|---|---|---|
| | $A_0$ | $B_0$ | $C_0$ | $A_+$ | $B_+$ | $C_+$ | $A_-$ | $B_-$ | $C_-$ |
| a | 82 | 37 | 0 | 123 | 14 | 0 | 0 | 0 | 0 |
| b | 82 | 37 | 0 | 0 | 0 | 0 | 106 | 31 | 0 |
| c | 82 | 37 | 0 | 24 | 0 | 0 | 65 | 48 | 0 |
| d | 82 | 0 | 51 | 123 | 0 | 0 | 0 | 0 | 0 |
| e | 82 | 0 | 68 | 0 | 0 | 0 | 106 | 0 | 0 |
| f | 82 | 0 | 68 | 71 | 0 | 0 | 35 | 0 | 0 |

Fig.7.

CODE MODULATION SYSTEM USING MODULATED DATA CODE TABLES

FIELD OF THE INVENTION

The present invention relates generally to a code modulation system, and more particularly, to a code modulation system for high density recording in a system to record digital data through a rotating transformer such as, for instance, a helical scanning type VTR (Video Tape Recorder), etc., and especially relates to a system which makes the upper limit of the number of continuous zero bits small.

BACKGROUND OF THE INVENTION

As is well known, on a system to record digital data via a rotating transformer such as a helical scanning type VTR, etc. as described above, a so-called DC (direct current) free modulation system having no low frequency power spectrum is desirable because it is difficult to transmit low frequency components. Various digital data modulation systems to realize this DC free and high density recording have been so far considered and, for instance, a code conversion system called the 8-14 modulation system which converts digital data into 14-bit data code in 8 bit-wise is described in the literature (National Technical Report, Vol. 32, No. 4, August 1986). This system is DC free type and has the density ratio of 1.4 which is higher than the density ratio of 1.0 of the EFM modulation system which has been so far commonly used.

The 8-14 modulation system converts digital data into 14-bit data code using Non-Return to Zero Inverted (NRZI) conversions, Codeword Digital Sum values (CDS), and Digital Sum Variation values (DSV).

In order to determine the CDS of a bit pattern an NRZI conversion is first performed. For example, the 14-bit code "01000101000010" is converted to a bit pattern of "01111001111100" through the use of a NRZI conversion, because a NRZI conversion reverses bit values in the converted bit-string when a "1" is encountered in the original bit string. The CDS calculation is then carried out on the converted bit pattern. An arithmetic sum is calculated by associating bits "0" and "1" with values −1 and +1, respectively. For example, the CDS value of the converted bit pattern is calculated as follows: (−1), (0), (1), (2), (3), (2), (1), (2), (3), (4), (5), (6), (5), (4). Thus the original 14-bit pattern "01000101000010" has a CDS value of 4.

The method for calculating a digital sum variation value is described, for example, in U.S. Pat. No. 4,731,678, which is incorporated herein by reference. The DSV value is accumulated one by one along an array of converted 14-bit patterns by adding the CDS value of the present 14-bit pattern to the DSV value of the preceding converted 14-bit pattern.

With respect to code assignment in an 8 to 14-bit modulation system, modulation codes having a DSV value "0" correspond with digital data on a one-for-one basis, while modulation codes having a DSV value other than "0" are divided into a positive DSV group and a negative DSV group, and two modulation codes are forced to correspond with one digital data, that is, on a one-for-two basis. FIG. 1 shows this corresponding relation. That is, the DSV (Digital Sum Variation) value is an integrated value of [1] (positive polarity) when the waveform after the NRZI (Non-Return to Zero Inverted) conversion of a modulation code train is H (high) level and [−1] (negative polarity) when it is L (low) level. In this case, however, the waveform after the NRZI conversion starts from L level. Therefore, the DSV value is accumulated one by one along an array of connected 14-bit patterns by adding the CDS value of the present 14-bit pattern to the DSV value of the preceding converted 14-bit pattern. In addition, CDS value is DSV within one modulation code.

A modulation data code is DC free if the absolute value of the DSV is always small and therefore, in the code conversion, a modulation code is selected from an appropriate group so that the fluctuation range of the DSV is limited.

On the other hand, in the case of the 8-14 modulation system, in a data code train that is transmitted 14 bit-wise after modulation, the minimum value d of continuous data "0" bits (hereinafter referred to as the zero bit) is set at 1 and the maximum value k is set at 8. That is, the number of continuous zero bits interposed between data "1" bit and next data "1" bit is over the range from 1 to 8.

In other words, data "1" bit is never continuous and at least one zero bit interposes between a data "1" bit and the next data "1" bit. Therefore, in order to restrict the number of continuous zero bits to below 8 not only with a single 14-bit data code but also for two successive 14-bit data codes, the number of continuous zero bits at the beginning and end portions of a 14-bit code is restricted to 4 and below. Thus, even when the number of continuous zero bits at the end side of the preceding 14-bit data code shown in FIG. 2(a) is 4 and that at the beginning side of succeeding 14-bit data code shown in FIG. 2(b) is also 4, the number of continuous zero bits among successive data codes can be set to 8, as shown in FIG. 2(c).

When digital data is recorded on a VTR, a shorter bit polarity inversion interval is better for purposes of self bit synchronization, crosstalk suppression, etc. Therefore, on the 8-14 modulation system, in order to reduce the upper limit for the number of continuous zero bits to 6 from 8, if the upper limit of 6 is given to the number of continuous zero bits within 14-bit data code and 3 is given to the number of continuous zero bits at both the beginning and end sides of a 14-bit data code in the same manner as described above, the number of usable data codes may become insufficient and it becomes impossible to construct modulation codes.

Further, the EFM modulation system which is used for compact disc systems, converts 8-bit digital data into 14-bit data code with a 3-bit binding data code inserted into the 14-bit data code as shown in FIG. 3. This binding data code is inserted to perform the waveform conversion by force so that H level and L level of recorded waveform correspond with each other when recording a data code train after the NRZI conversion.

In this case, as no upper limit is given to the number of continuous zero bits as in the above 8-14 modulation system but the same operation is carried out in a sense to perform the polarity inversion at a required place, and as a result of adding 3-bit redundant binding data code, recording efficiency drops in opposition to high density recording.

As described above, on the conventional code conversion system, for instance, in case of the 8-14 modulation system, the upper limit for the number of continuous zero bits is restricted to 8 and to make it smaller it is necessary to allow the addition of a new redundant bit which impedes of high-density recording results.

SUMMARY OF THE INVENTION

It is, therefore, an object of the present invention to provide a very satisfactory code modulation system capable of making the upper limit for the number of continuous zero bits small without adding a new redundant bit, etc.

In order to achieve the above object, a code modulation system according to one aspect of the present invention is provided to perform the NRZI conversion after converting m bit-wise digital data into n bit-wise data code where n>m. Data code with CDS value "0" is forced to correspond with digital data on a one-for-one basis, while data code having CDS value other than "20" is forced to correspond with data code selected from the positive and negative groups of CDS values on a one-for-two basis and data code is so selected that DSV value becomes "0" based on DSV value and the NRZI converted waveform polarity.

When the upper limit value k for the number of continuous zero bits in a data code, the minimum succession value d(d>1) of continuous zero bits between non-zero bits, and the upper limit value ke ( k) of the number of continuous zero bits at the end side of a data code are set, the number of continuous zero bits at the beginning side of a data code is classified into three groups: Group A which satisfies k>ke+ks, Group B which satisfies k<ke+ks and Group C of which beginning bits are not zero bits. If the end bit of a data code is not a zero bit, a data code following that data code is selected from Groups A and B. If the end bit of a data code is a zero bit, when a data code following that data code is selected from Groups A and C, a data code of Group C which has the same polarity of CDS as data code of Group B or CDS value "0" is provided, and when selecting a data code of Group B, a data code of Group C corresponding to that data code is selected as modulated output.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 1 is a diagram for explaining the DSV control means;

FIG. 4 is a diagram for explaining the embodiment of the code modulation system involved in the present invention;

FIG. 5 is a diagram showing the number of modulated data code having the bit pattern satisfying the conditions set in the embodiment by CDS value;

FIG. 7 is a diagram showing the number of modulated data code included in the conversion tables set in the embodiment.

DESCRIPTION OF THE PREFERRED EMBODIMENTS

Figure 2A:
FIG. 2(a), 2(b) and 2(c) are diagrams for explaining the joint portion of the modulation data code in the conventional 8-14 modulation system.
Figure 2B:
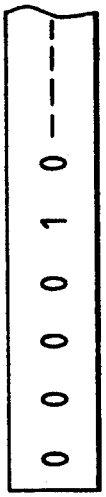
Figure 2C:
Figure 3:
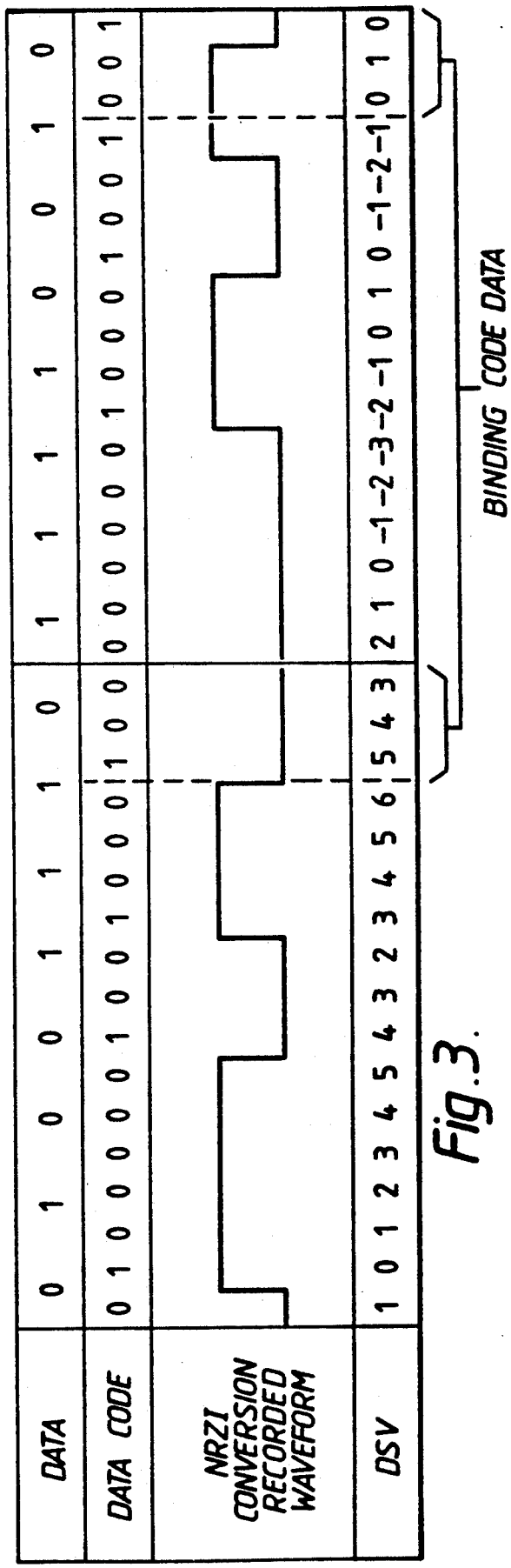
FIG. 3 is a diagram for explaining binding data code in the EFM modulation system.

The present invention will be described in detail with reference to the FIGS. 4 through 8. Throughout the drawings, reference numerals or letters used in FIGS. 1 through 3 will be used to designate like or equivalent elements for simplicity of explanation.

In this embodiment the 8-14 modulation system which converts 8 bit-wise input digital data into 14 bit-wise modulation data code is explained. That is, the number of data code having the bit pattern satisfying all conditions shown in the following (1) through (3) is checked by CDS value from 14-bit modulated data code ($2^{14}$);

(1) Out of 14-bit modulated data code, those data code having no pattern of more than 2 continuous data "1" bits.

(2) Out of 14-bit modulated data code those data code of which number of continuous zero bits is less than 6.

(3) Out of 14-bit modulated data code, those data of which of continuous zero bits at the end side is less than 4.

FIG. 5 shows the number of modulated data code having the bit pattern satisfying all of the conditions shown in (1) through (3), above by CDS value. In FIG. 5, however, the number of modulated data code with the same CDS value is further divided into three groups satisfying the conditions of Groups A, B and C.

Group A: Out of 14-bit modulated data code, those of which the beginning bit is a zero bit and the number of continuous zero bits at the beginning side is less than 2.

Group B: Out of 14-bit modulated data code, those of which the beginning bit is a zero bit and the number of continuous zero bits at the beginning side is less than 3.

Group C: Out of 14-bit modulated data code, those of which beginning bit is data "1".

Figure 6:
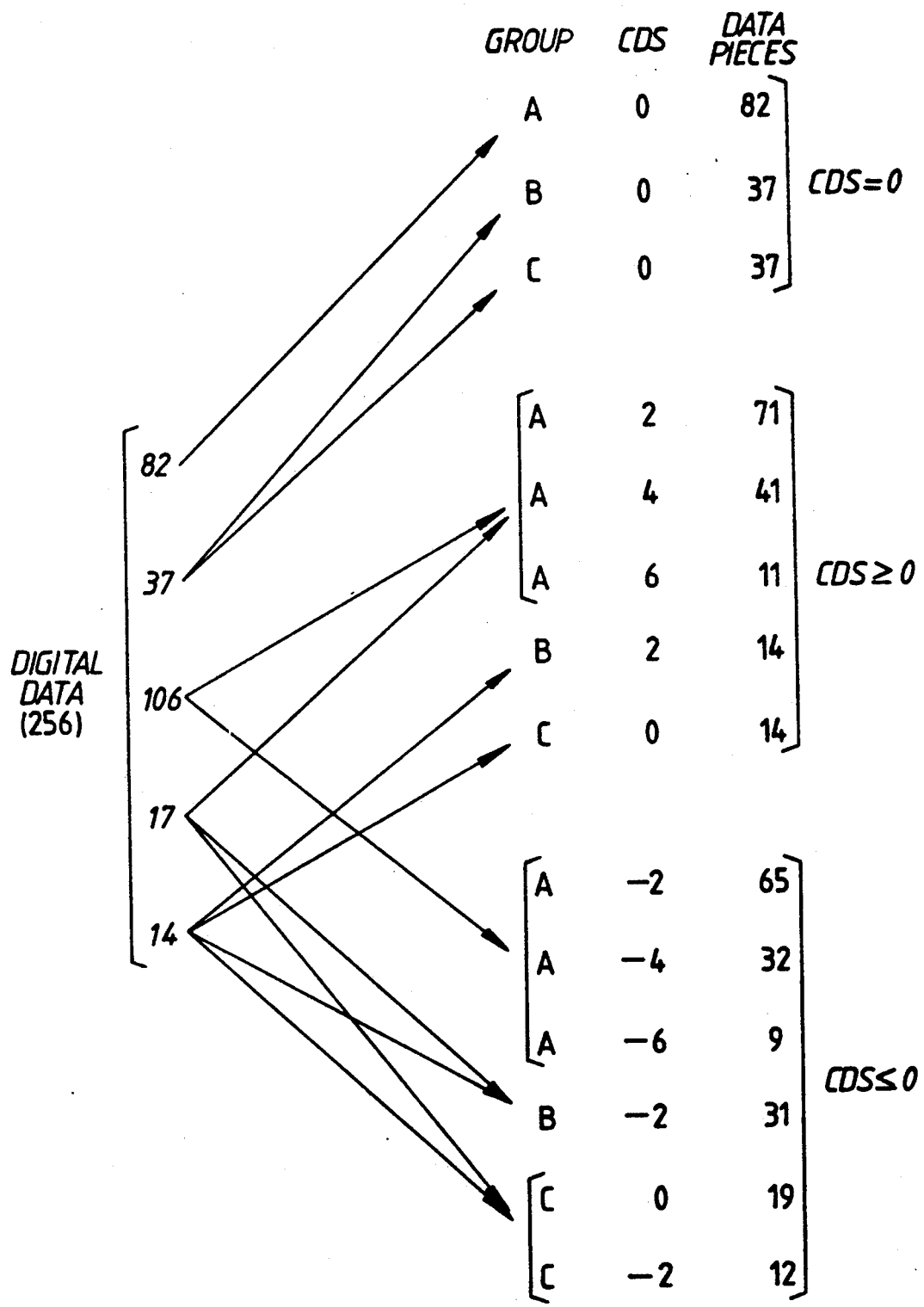
FIG. 6 is a diagram showing the correlation of 8 bit-wise digital data set in the embodiment with 14-bit wise modulation data code.

Here, the modulated data code of respective groups shown in FIG. 5 are correlated with 8-bit ($2^8=256$) input digital data as shown in FIG. 6. As to the rules for combining the input digital data with the modulated data code, as described previously, first, modulated data code with CDS value "0" which correspond to input digital data on a one-for-one basis are intended. As to the modulated data code having a CDS value other than "0", divided into a positive CDS value group and a negative CDS value group and correspond one modulated data code from each group, that is, two data code with one input digital data on a one-for-two basis.

Modulated data code to be used at this time are selected from the above groups A and B. When modulated data code is selected from Group B, modulated data code of Group C having the same CDS polarity as Group B modulated data code or the CDS value "0" correspond with input digital data as sub-data code. Therefore, if two modulated code of Group B having positive and negative CDS values were selected for one 8-bit input digital-data, modulated data code of Group C correspond as sub-data code with the selected two modulated data code and therefore, input digital data and modulated data code correspond with each other on a one-for-four basis.

To obtain modulated data code having the correlation with input digital data determined as shown above, set six kinds of conversion tables a-f in advance as shown below, in which input digital data and modulated data code correspond with each other on the one-for-one basis, and selecting these conversion tables a-f based on the rules described later, take out modulated data code from the selected conversion table. In these six kinds of conversion tables a-f, modulated data code with the following conditions have been set while corresponding with input digital data on the one-for-one basis.

a: Out of modulated data code of Groups A and B, those consisting of modulated data code having 0 or positive CDS value.

b: Out of modulated data code of Groups A and B, those consisting of modulated data code having 0 or negative CDS value.

c: Out of the modulated data code of tables a and b, those modulated data code determined by taking the CDS absolute value of corresponding entries in the respective tables and choosing the modulated data code whose CDS absolute value is less than the CDS absolute value of the corresponding entry in the other table.

d: Out of the modulated data code of the conversion table a, those consisting of modulated data code by replacing Group B with Group C.

e: Out of the modulated data code of the conversion table b, those consisting of modulated data code by replacing Group B with Group C.

f: Out of the modulated data code of tables e and f, those modulated data code determined by taking the CDS absolute value of corresponding entries in the respective tables and choosing the modulated data code whose CDS absolute value is less than the CDS absolute value of the corresponding entry in the other table.

Of the modulated data code of Groups A, B and C shown in FIG. 5, those with the positive CDS polarity are classified as A+, B+ and C+, those with the CDS value "0" as Ao, Bo and Co, and those with the negative CDS polarity as A−, B− and C−, and the number of modulated data code contained in each of these 9 data groups is shown in FIG. 7.

As described above, after setting six kinds of the conversion tables a-f in which input digital data corresponds with modulated data code on a one-for-one basis, the modulated data code selection is carried out based on the following two rules I and II.

I: Select modulated data code having DSV values which are close to "0" like the previously described 8-14 modulation system.

II: Select modulated data code from Group A or B if the end bit of the modulated data code immediately before is data "1" and select modulated data code from Group A or C if the end bit of the modulated data code immediately before is data "0".

To satisfy two rules I and II described above means to select the conversion tables a-f as shown in FIG. 4 from the relation among DSV, waveform polarity and the end bit of modulation data code immediately before from the viewpoint of selecting six kinds of the conversion table a-f.

Waveform polarity is determined by accumulating a waveform polarity value, bit by bit, along the 14-bit code word according to the equation $Wpm = Wpm-1 + Wpm$ where $1+0 \rightarrow 1$ $1+1 \rightarrow 0$ $0+0 \rightarrow 0$ $0+1 \rightarrow 1$ where + represents the "modulo 2" addition.

To satisfy rules I and II, if the end bit of the modulation data code immediately before is data "1", the upper limit for the number of continuous zero bits is required to be guaranteed only at the beginning side of the modulated data code following that data code and the lower limit must be guaranteed by the beginning bit of the following modulated data code. As the lower limit of the number of continuous zero bits is 1 in this embodiment, modulated data code is selected from Groups A and B of which beginning bit is a zero bit, that is, from the conversion tables a, b and c.

Further, the upper limit of the number of continuous zero bits must be guaranteed jointly with the beginning bit of the following modulated data code if the end bit of the modulated data code immediately before is a zero bit. In this embodiment, from the previously described condition (3), the upper limit of the number of continuous zero bits at the end side of 14-bit modulated data code is 4 and from the condition (2), the upper limit of the number of continuous zero bits of 14-bit modulated data code is 6 and therefore, the upper limit of the number of continuous zero bits at the beginning side of the following modulated data code is up to 2.

Further, in this case, the condition that the lower limit of the number of continuous zero bits is 1 is guaranteed by the end bit of the modulated data code immediately before and therefore, there will be nothing wrong for the beginning bit of the following modulated data code being "1". Therefore, if the end bit of the modulated data code immediately before is a zero bit, modulated data code is selected from Groups A and C, that is, the conversion tables d, e and f.

Figure 8:
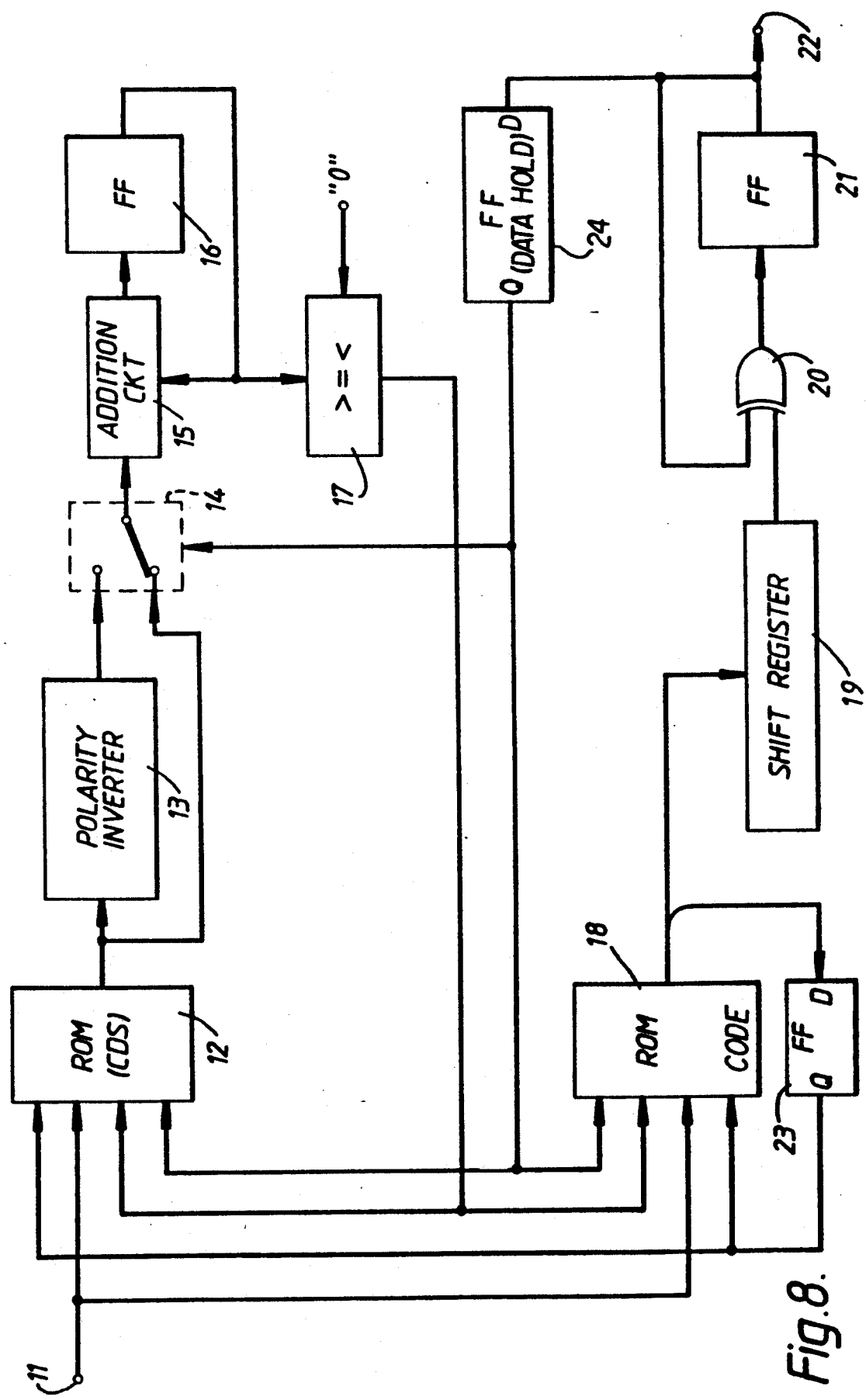
FIG. 8 is a block diagram showing the concrete example of the 8-14 modulation circuit using the system of the present invention

FIG. 8 shows the concrete construction of the 8-14 modulation circuit using the system of this invention. Eight bit-wise digital data is input to the input terminal 11, the conversation tables a-f described above are saved and supplied to the ROM (Read Only Memory) 18 which composes the 8-14 conversion circuit. From this ROM 18, the conversion tables a-f are selected according to the rules shown in FIG. 4 based on the output showing DSV polarity (positive, zero, negative) immediately before from the comparator 17, the output showing the waveform polarity after the NRZI conversion immediately before from the exclusive OR circuit (hereinafter referred to as the EX-OR circuit) 20, and the output showing the last bit of the modulated data code immediately before from the flip-flop circuit (hereinafter referred to as the FF circuit), and 14-bit modulated data code are read out in parallel with each other.

Further, the same input as that to the ROM 18 is supplied to ROM 12 which saves CDS values of the modulated data code (here, the waveform polarity at the start point of the NRZI conversion is assumed to be negative) and CDS values of the modulated data code from ROM 18 are output.

In this case, if the polarity of the waveform immediately before is positive, the polarity of practically effective CDS values to be added to DSV values is inverted and therefore, practically effective CDS values are supplied to the DSV calculation circuit consisting of the addition circuit 15 and the FF circuit 16 using the inverting circuit 13 and the switch 14.

In the addition circuit 15 of DSV calculation circuit, new DSV values are always calculated, and supplied to the comparator 17 where they are compared with data "0" and the data showing the polarity (positive or negative) is output.

The 14-bit modulated data code which are output in parallel with each other from the ROM 18, after being converted into serial data in the shift register 19, are NRZI converted in the NRZI conversion circuit consisting of the EX-OR circuit 20 and the FF circuit 21 and taken out of the output terminal 22.

Further, the present invention is not restricted only to the embodiment described above but is applicable in various modified forms within the range not deviating from the intention of the invention.

According to the means described above, the number of usable data code can be increased organically because restrictions on the number of continuous zero bits at the beginning side of a data code can be relaxed and the upper limit for the number of zero bits can be made small without newly adding redundant bits, etc.

As described above, the present invention can provide an extremely preferable code modulation system.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. A modulation circuit apparatus comprising:
   input means for receiving m-bit digital data codes;
   table means for storing a plurality of conversion tables, each table including a conversion from an m-bit digital data code to an n-bit modulated data code, where n>m;
   digital sum variation calculation means for determining a digital sum variation polarity value of said modulated data code;
   non-return to zero inverted conversion means for converting said digital data code to a waveform polarity value, said waveform polarity value being either positive or negative;
   waveform polarity determining means for determining the value of a predetermined bit of a preceding modulated data code;
   table selecting means for selecting one of the plurality of conversion tables in accordance with the digital sum variation polarity value, the waveform polarity value, and the value of the predetermined bit of the preceding modulated data code;
   modulated data code selecting means for selecting a modulated data code from said selected conversion table that corresponds to the digital data code; and
   output means to output said modulated data code.

2. The modulation circuit apparatus of claim 1, wherein the table means further comprises:
   modulated data code generating means for generating n-bit modulated data codes;
   group means for grouping said generated n-bit modulated data codes into at least three groups, wherein:
      a first group comprises n-bit modulated data codes in which the first bit is a zero and the number of zero bits, starting at and counting from the first bit, is less than 2;
      a second group comprises n-bit modulated data codes in which the first bit is a zero and the number of zero bits, starting at and counting from the first bit, is less than 3;
      a third group comprises n-bit modulated data codes in which the first bit is a one;
   table creation means for creating at least six tables containing n-bit modulated data codes, wherein:
      a first table comprises modulated data codes from the first and second groups which do not have a negative Codeword Digital Sum,
      a second table comprises modulated data codes from the first and second groups which do not have a positive Codeword Digital Sum,
      a third table comprises modulated data codes determined by taking the lesser of an absolute value of a Codeword Digital Sum of respective entries of the first and second tables,
      a fourth table comprises modulated data codes from the first and third groups which do not have a negative Codeword Digital Sum,
      a fifth table comprises modulated data codes from the first and third groups which do not have a positive Codeword Digital Sum,
      a sixth table comprises modulated data codes determined by taking the lesser of an absolute value of a Codeword Digital Sum of respective entries of the fourth and fifth tables.

3. The modulation circuit apparatus of claim 2 wherein the modulated data code generating means generates only n-bit modulated data codes which: (1) have no pattern of more than 2 continuous data "1" bits, and (2) have fewer than 6 continuous zero bits in any portion of the n-bit code and (3) have fewer than 4 continuous zero bits, at the start and at the end of the n-bit code.

4. The modulation circuit apparatus of claim 2, wherein the table selecting means comprises:
   first table selection means for selecting said first table both when said digital sum variation comparator means is positive, said non-return to zero inverted conversion means is positive, said bit determining means is one, and when said digital sum variation comparator means is negative, said non-return to zero inverted conversion means is negative, and said bit determining means is one;
   second table selection means for selecting said second table both when said digital sum variation comparator means is positive, said non-return to zero inverted conversion means is negative, and said bit determining means is one, and when said digital sum variation comparator means is negative, said non-return to zero inverted conversion means is positive, said bit determining means is one;

third table selection means for selecting said third table both when said digital sum variation comparator means is zero, said non-return to zero inverted conversion means is positive, said bit determining means is one, and when said digital sum variation comparator means is zero, said non-return to zero inverted conversion means is negative, said bit determining means is one;

fourth table selection means for selecting said fourth table both when said digital sum variation comparator means is positive, said non-return to zero inverted conversion means is positive, said bit determining means is one, and when said digital sum variation comparator means is negative, said non-return to zero inverted conversion means is negative, said bit determining means is zero;

fifth table selection means for selecting said fifth table both when said digital sum variation comparator means is positive, said non-return to zero inverted conversion means is negative, said bit determining means is zero, and when said digital sum variation comparator means is negative, said non-return to zero inverted conversion means is positive, said bit determining means is zero;

sixth table selection means for selecting said sixth table both when said digital sum variation comparator means is zero, said non-return to zero inverted conversion means is positive, said bit determining means is zero, and when said digital sum variation comparator means is zero, said non-return to zero inverted conversion means is negative, said bit determining means is zero.

* * * * *

UNITED STATES PATENT AND TRADEMARK OFFICE
CERTIFICATE OF CORRECTION

PATENT NO. : 5,196,848
DATED : March 23, 1993
INVENTOR(S) : Yoshihisa Sakazaki

It is certified that error appears in the above-indentified patent and that said Letters Patent is hereby corrected as shown below:

```
On the title page, insert the following:
--[30] Foreign Application Priority Data
       Jul. 13, 1990 [JP] Japan...... P02-184014--
```

Signed and Sealed this

Twenty-ninth Day of March, 1994

Attest:

BRUCE LEHMAN

*Attesting Officer*  *Commissioner of Patents and Trademarks*